(12) United States Patent
Jeong et al.

(10) Patent No.: US 12,424,972 B2
(45) Date of Patent: Sep. 23, 2025

(54) HIGH-POWER SHINGLED PHOTOVOLTAIC STRING CONTROLLABLE IN LENGTH AND WIDTH AND METHOD FOR MANUFACTURING MODULE THEREOF

(71) Applicant: KOREA INSTITUTE OF INDUSTRIAL TECHNOLOGY, Cheonan-si (KR)

(72) Inventors: Chae Hwan Jeong, Gwangju (KR); Min Joon Park, Gwangju (KR); Sung Min Youn, Gwangju (KR); Jin Ho Song, Gwangju (KR); Dae Han Moon, Gwangju (KR); Tae Wung Jeong, Gwangyang-si (KR); Han Jun Kim, Gwangju (KR)

(73) Assignee: KOREA INSTITUTE OF INDUSTRIAL TECHNOLOGY, Cheonan-si (KR)

( * ) Notice: Subject to any disclaimer, the term of this patent is extended or adjusted under 35 U.S.C. 154(b) by 31 days.

(21) Appl. No.: 18/255,178

(22) PCT Filed: Apr. 23, 2021

(86) PCT No.: PCT/KR2021/005160
§ 371 (c)(1),
(2) Date: May 31, 2023

(87) PCT Pub. No.: WO2022/124489
PCT Pub. Date: Jun. 16, 2022

(65) Prior Publication Data
US 2024/0007049 A1    Jan. 4, 2024

(30) Foreign Application Priority Data

Dec. 9, 2020 (KR) .................. 10-2020-0171701

(51) Int. Cl.
*H02S 40/36* (2014.01)
*H02S 20/25* (2014.01)

(52) U.S. Cl.
CPC .............. *H02S 40/36* (2014.12); *H02S 20/25* (2014.12)

(58) Field of Classification Search
CPC .................................. H02S 40/36; H02S 20/25
See application file for complete search history.

(56) References Cited

U.S. PATENT DOCUMENTS

2017/0323995 A1*  11/2017  Gislon ................ H01L 31/0504

* cited by examiner

*Primary Examiner* — Tae-Sik Kang

(57) ABSTRACT

Disclosed are a high-power shingled photovoltaic string controllable in length and width and a method for manufacturing a module thereof. The method for manufacturing a high-power shingled photovoltaic module comprises the steps of: primarily cutting a bulk silicon substrate along a first cut line parallel to a bus bar electrode using laser scribing, thereby dividing the bulk silicon substrate into unit cells; forming an intermediate processing junction substrate by shingled-joining a plurality of unit cells according to the length of a string; forming the string by secondarily cutting the intermediate processing junction substrate seated on a substrate fixing jig, the intermediate processing junction substrate being cut along a second cut line that is perpendicular to the bus bas electrode and set according to the width of the string; and laminating a protective member on the surfaces of a plurality of strings to form a photovoltaic module.

4 Claims, 13 Drawing Sheets

(a)

(b)

(a)

(b)

(a)

(b)

(a)

(b)

(c)

HIGH-POWER SHINGLED PHOTOVOLTAIC STRING CONTROLLABLE IN LENGTH AND WIDTH AND METHOD FOR MANUFACTURING MODULE THEREOF

TECHNICAL FIELD

The present invention relates to a high-power shingled photovoltaic string controllable in length and width and a method of manufacturing a module using the same, in which a length and a width of a string constituting a photovoltaic module are controllable and, when the string is formed by processing a bulk silicon substrate, the number of joining processes of divided cells is reduced to increase the manufacturing efficiency of the photovoltaic module.

BACKGROUND ART

While silicon bulk photovoltaic modules are widely used in the field of solar power generation technology, inorganic-type (a silicon thin film, light convergence type GaAs, CIGS, and perovskite structure), organic-type, and dye-type solar cells are being researched and developed.

Recently, due to energy and environmental problems, research has been conducted on a method of using power generated by solar cells using a building integrated photovoltaic (BIPV) module manufactured to be used as a replacement for exterior walls and windows of buildings.

Building exterior wall type BIPV modules are largely divided into exterior wall attachment type (WAVA) modules, exterior wall finishing type (siding PV) modules, and roof type PV modules repurposed as exterior walls, and the market for building embedded exterior wall type BIPV modules is showing an increasing trend. Under this background, there is an increasing demand for designable photovoltaic modules suitable for various structures and shapes according to a part of a building, and as a building exterior material, a high-power shingled type PV module with variable length and width is required to be applied to exteriors and roofs.

DISCLOSURE

Technical Problem

As shown in FIG. 1, in a string manufacturing process for manufacturing a conventional photovoltaic module, a bus bar electrode 2 is formed and a string is manufactured by joining a plurality of divided cells 1. Since only a length of the module is adjusted according to the number of joined cells 1, and the bus bar electrode 2 formed on a long side of the cell is constant, there is a problem that workability is degraded when the module is applied as an exterior material of a building.

The present invention is directed to providing a high-power shingled photovoltaic string controllable in length and width and a method of manufacturing a module using the same, in which a length and a width of a string constituting a photovoltaic module are controllable and, when the string is formed by processing a bulk silicon substrate, the number of joining processes of divided cells is reduced to increase the manufacturing efficiency of the photovoltaic module.

Technical Solution

One aspect of the present invention provides a method of manufacturing a high-power shingled photovoltaic module controllable in length and width, which includes (a) preparing a bulk silicon substrate on which bus bar electrodes and finger electrodes are formed, (b) primarily cutting the bulk silicon substrate along first cut lines parallel to the bus bar electrode by laser scribing to divide the bulk silicon substrate into a plurality of unit cells, (c) shingled-joining the plurality of unit cells to correspond to a length of a string to form an intermediate processing junction substrate, (d) mounting the intermediate processing junction substrate on a substrate fixing jig and secondarily cutting the intermediate processing junction substrate along second cut lines perpendicular to the bus bar electrode by laser scribing to form a plurality of strings, and (e) laminating surfaces of the plurality of strings using a protective member to form a photovoltaic module, wherein the first cut line is set to correspond to an interval between the bus bar electrodes, and the second cut line is set to correspond to a width of the string constituting the photovoltaic module.

After the first cut lines and the second cut lines are formed on the bulk silicon substrate, primary cutting, bonding, and second cutting may be performed.

After the bulk silicon substrate is divided into unit cells, the second cut line may be formed by laser scribing.

The substrate fixing jig may be provided with a plate having a step on a surface of a body thereof corresponding to a shape of the intermediate processing junction substrate or may fix the intermediate processing junction substrate using a holder configured to fix one side of the intermediate processing junction substrate.

Another aspect of the present invention provides a high-power shingled photovoltaic string controllable in length and width and constituting a photovoltaic module, which is formed by cutting an intermediate processing junction substrate in which unit cells cut along first cut lines parallel to bus bar electrodes formed on a bulk silicon substrate are shingled-joined along second cut lines perpendicular to the bus bar electrodes, wherein the first cut line is set to correspond to an interval between the bus bar electrodes, and the second cut line is set to correspond to a width of the string constituting the photovoltaic module.

Advantageous Effects

In accordance with to the present invention, since a bulk silicon substrate is primarily cut to form cells, the cells are shingled-joined to form an intermediate processing junction substrate, and strings are formed through a process of secondarily cutting the intermediate processing junction substrate, the number of joining processes is reduced so that the manufacturing efficiency of a photovoltaic module can be increased.

In accordance with the present invention, since a length and a width of the string constituting the photovoltaic module can be controlled, the photovoltaic module can be used for exterior wall and window replacement facilities of buildings, farming facilities, urban distributed power supply, photovoltaic sound barriers, and soundproof tunnels.

MODES OF THE INVENTION

Figure 1:
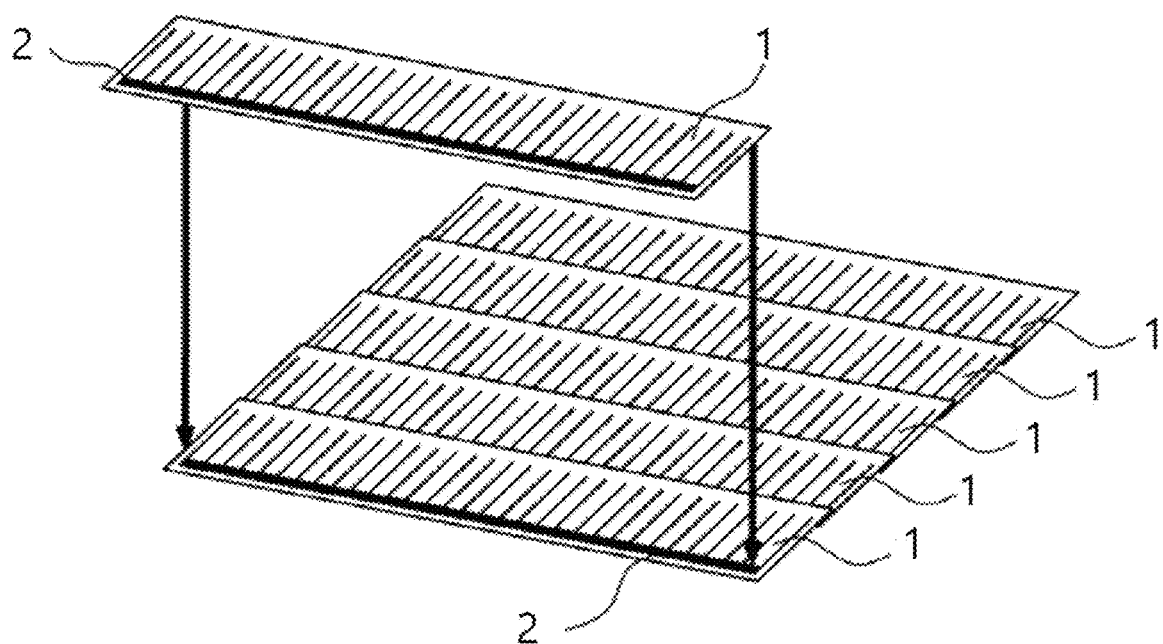
FIG. 1 is a diagram illustrating a method of manufacturing a conventional shingled photovoltaic string.

Hereinafter, embodiments of the present invention will be described with reference to the accompanying drawings. Like reference numerals in each drawing indicate like members. In addition, in describing the present invention, when a detailed description of a known related function or configuration is determined to unnecessarily obscure the gist of the present invention, the detailed description thereof will be omitted herein. Further, when a part is referred to as "including" a component, this means that the part can include another element, rather than excluding another element, unless specifically stated otherwise.

According to an embodiment of the present invention, a length and a width of a string constituting a photovoltaic module is controllable and, when the string is formed by processing a bulk silicon substrate, the number of joining processes of divided cells is reduced, and thus the manufacturing efficiency of the photovoltaic module can be increased. Although the bulk silicon substrate is targeted in embodiments, the present invention is not limited thereto, and the string may be formed by joining divided cells in a shingled manner and may be applied to any solar cell capable of solar power generation.

Figure 2:
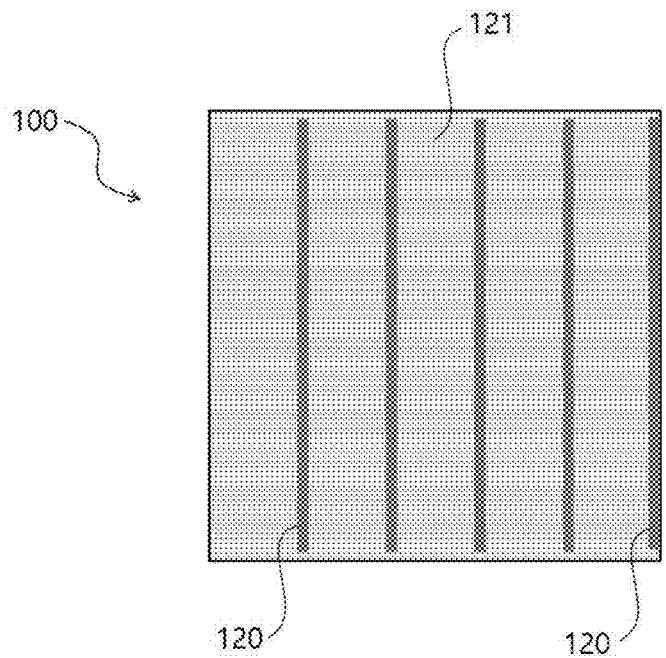
FIG. 2 shows diagrams illustrating a process of forming first and second cut lines on a bulk silicon substrate according to an embodiment of the present invention.
Figure 2:
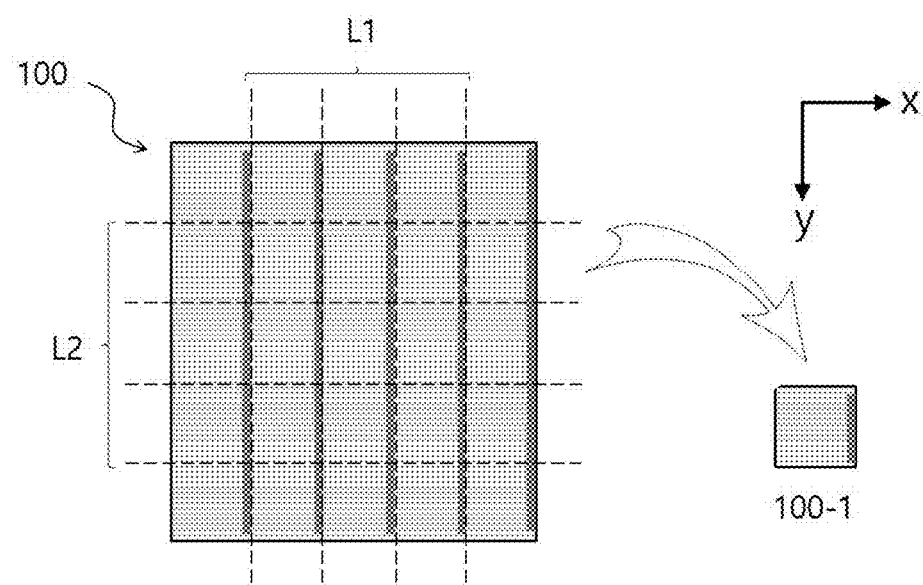

As shown in FIG. 2A, a bulk silicon substrate 100 of which a front surface is provided with a bus bar electrode 120 and a finger electrode 121 formed thereon is used as a raw material of the photovoltaic module. The finger electrode 121 is provided as a plurality of finger electrodes 121 arranged perpendicular to the bus bar electrode 120, and one side of the finger electrode 121 is connected to the bus bar electrode 120. The finger electrode 121 collects photoelectrically converted carriers and has a line width of 0.08 mm to 0.12 mm. The bus bar electrode 120 serves to transfer the carriers, which are collected by the finger electrode 121, to an external storage battery or the like.

The shingled type photovoltaic module may be formed by joining basic unit cells. For example, in FIG. 2B, when a segmented cell 100-1 is a basic unit, in order to divide the bulk silicon substrate 100 into segmented cells 100-1 each having a predetermined length in an x-axis direction and a predetermined width in a y-axis direction, the bulk silicon substrate 100 may be cut along the first cut lines L1 parallel to the bus bar electrode 120 and cut along the second cut lines L2 perpendicular to the bus bar electrode 120. When a string is manufactured by joining the plurality of segmented cells 100-1, each of which is a basic unit, a joining process increases in proportion to the number of divided segmented cells, which becomes a factor in degrading the manufacturing efficiency of a photovoltaic module.

In the embodiment of the present invention, a length and a width of a string are varied through a processing process of primary cutting, joining, and secondary cutting of the bulk silicon substrate, and further a cell joining process is shortened so that the manufacturing efficiency of a photovoltaic module can be increased.

Figure 3:
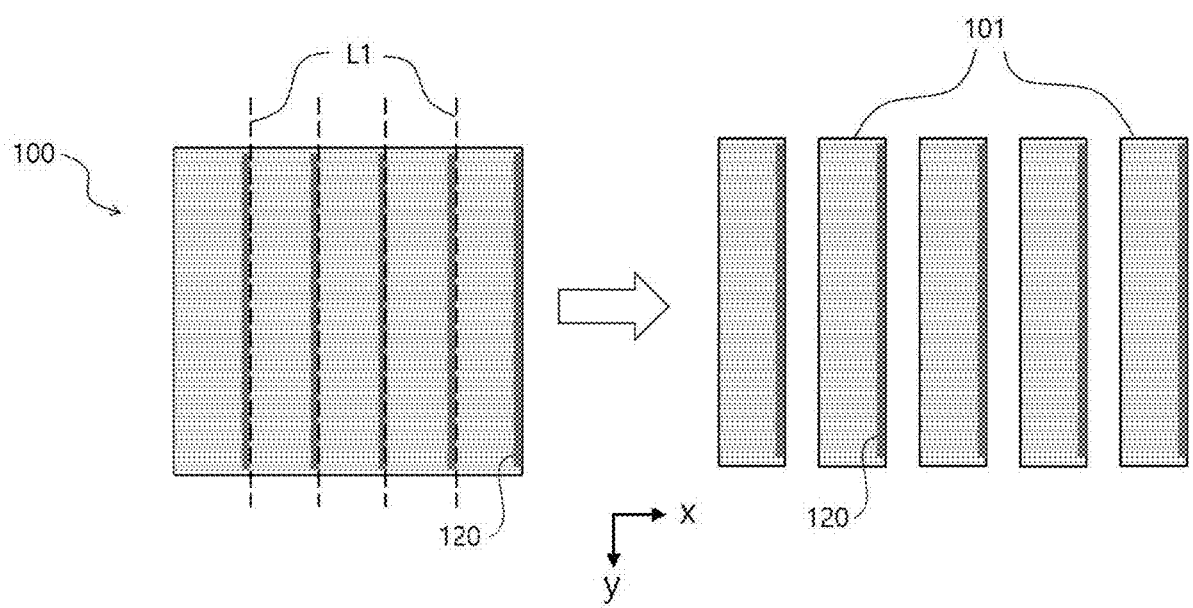
FIG. 3 shows diagrams illustrating a process of forming a unit cell by cutting the bulk silicon substrate along the first cut lines according to an embodiment of the present invention.

First, as shown in FIG. 3, the bulk silicon substrate 100 is cut along the first cut lines L1. The first cut lines L1 are set parallel to the bus bar electrodes 120, and an interval between the first cut lines L1 corresponds to an interval between the bus bar electrodes 120. A plurality of unit cells 101 of equal size are obtained by primary cutting along the first cut lines L1 by laser scribing. Here, process conditions for the laser scribing may be set such that an average power is 10 W, a frequency is 50 kHz, and a projecting speed is 1,300 mm/s in a 20 ns laser using a 532 nm wavelength to perform the laser scribing.

Each unit cell 101 includes a bus bar electrode 120 disposed on a front edge of the cell, a plurality of finger electrodes 121 connected to the bus bar electrode 120, and a rear electrode 140 formed on a rear surface of the cell.

Figure 4:
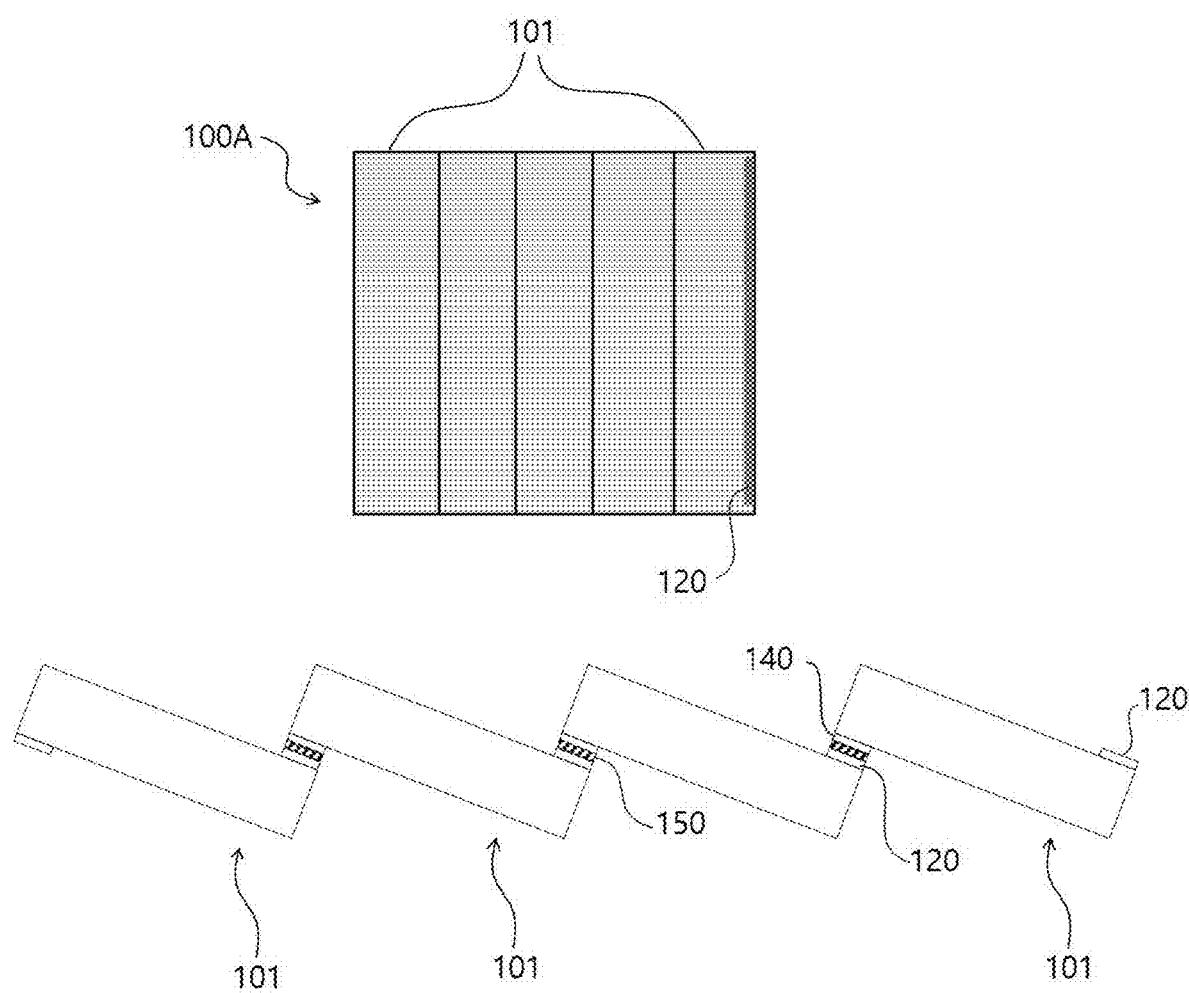
FIG. 4 shows diagrams illustrating a process of shingled-joining unit cells according to an embodiment of the present invention.

Then, as shown in FIG. 4, the plurality of divided unit cells 101 are joined in a shingled manner by a conductive adhesive 150 as a medium to obtain an intermediate processing junction substrate 100A joined in the shingled manner. For example, the bus bar electrode 120 formed on a front surface of one divided unit cell 101 and the rear electrode 140 of another divided unit cell 101 overlap, and the overlapping portions are joined with the conductive adhesive 150 interposed therebetween through a thermal processing process. The bonding process may be performed under thermal processing conditions of a temperature of 130° C. to 150° C. for 25 to 35 seconds.

A product with high conductivity and appropriate viscosity suitable for the present invention among conductive adhesives on the market, for example, EL-3012, EL-3556, EL-3653, and EL-3655 by Panacol-Korea Co., Ltd. and CE3103WLV and CA3556HF by Henkel Ag & Co. KGaA may be applied as the conductive adhesive 150. For example, an adhesive with a viscosity of 28,000 mPa·s(cP) to 35,000 mPa·s(cP) at a temperature of 25° C., volume resistivity of 0.0025 Ω·cm as an electrical characteristic, a curing temperature of 130° C. to 150° C., and a curing time of 25 to 35 seconds is applied as the conductive adhesive 150. In addition, conductive filler in the conductive adhesive may include at least one material selected from Au, Pt, Pd, Ag, Cu, Ni, and carbon.

Figure 5:
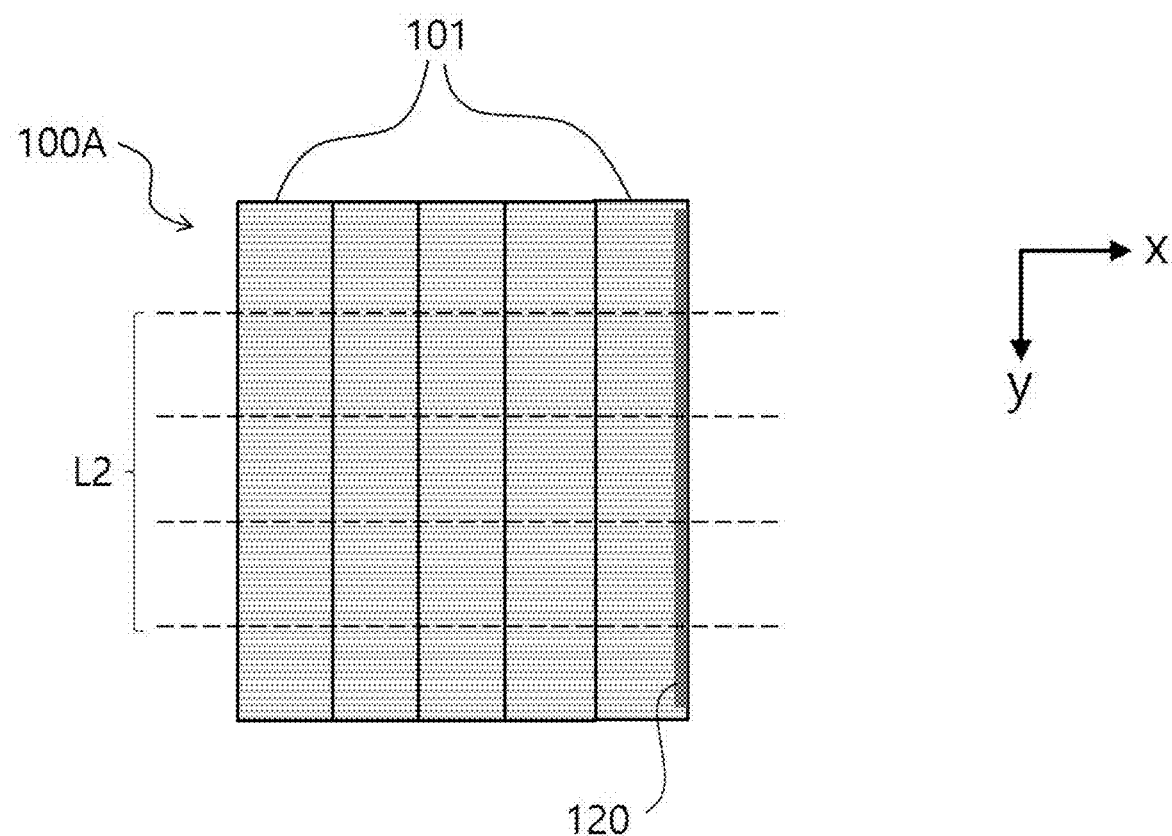
FIG. 5 is a diagram illustrating a method of setting the second cut line for cutting a shingled-joined intermediate processing junction substrate according to an embodiment of the present invention.

Then, as shown in FIG. 5, the intermediate processing junction substrate 100A in which the unit cells 101 are joined in the shingled manner is secondarily cut along the second cut lines L2 to equally divide the intermediate processing junction substrate 100A into five pieces. The second cut lines L2 are set to correspond to a width of a string constituting the photovoltaic module and are for cutting in a direction perpendicular to the bus bar electrode 120.

Figure 6:
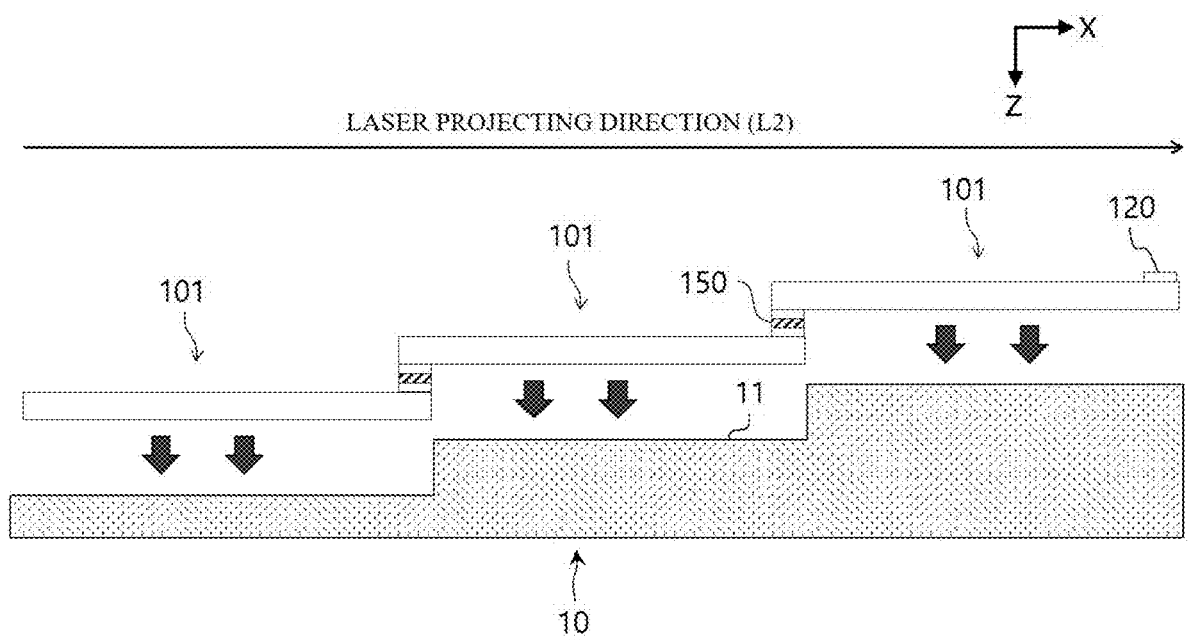
FIG. 6 is a diagram illustrating a process of mounting the shingled-joined intermediate processing junction substrate on a substrate fixing jig according to an embodiment of the present invention.
Figure 7:
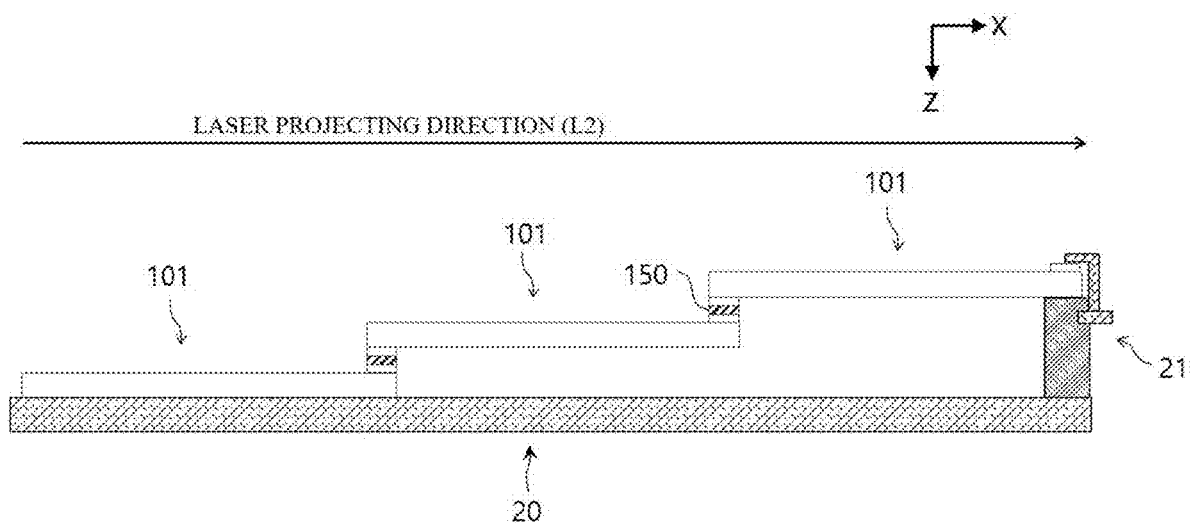
FIG. 7 is a diagram illustrating a process of fixing the shingled-joined intermediate processing junction substrate using the substrate fixing jig and a holder according to an embodiment of the present invention.

Since a lower surface of the intermediate processing junction substrate 100A joined in the shingled manner is uneven in the form of steps, a substrate fixing jig is used for a stable cutting method by projecting a laser by laser scribing. As shown in FIG. 6, a substrate fixing jig 10 has steps formed on a surface of a body thereof corresponding to the shape of the facing intermediate processing junction substrate 100A. A cutting process may be performed using the substrate fixing jig 10 in a state in which the intermediate processing junction substrate 100A is mounted thereon. As shown in FIG. 7, a substrate fixing jig 20 of another embodiment further includes a holder 21 for fixing one side of the intermediate processing junction substrate 100A. The holder 21 may fix one side of the intermediate processing junction substrate 100A placed at a predetermined height from a jig body.

Figure 8:
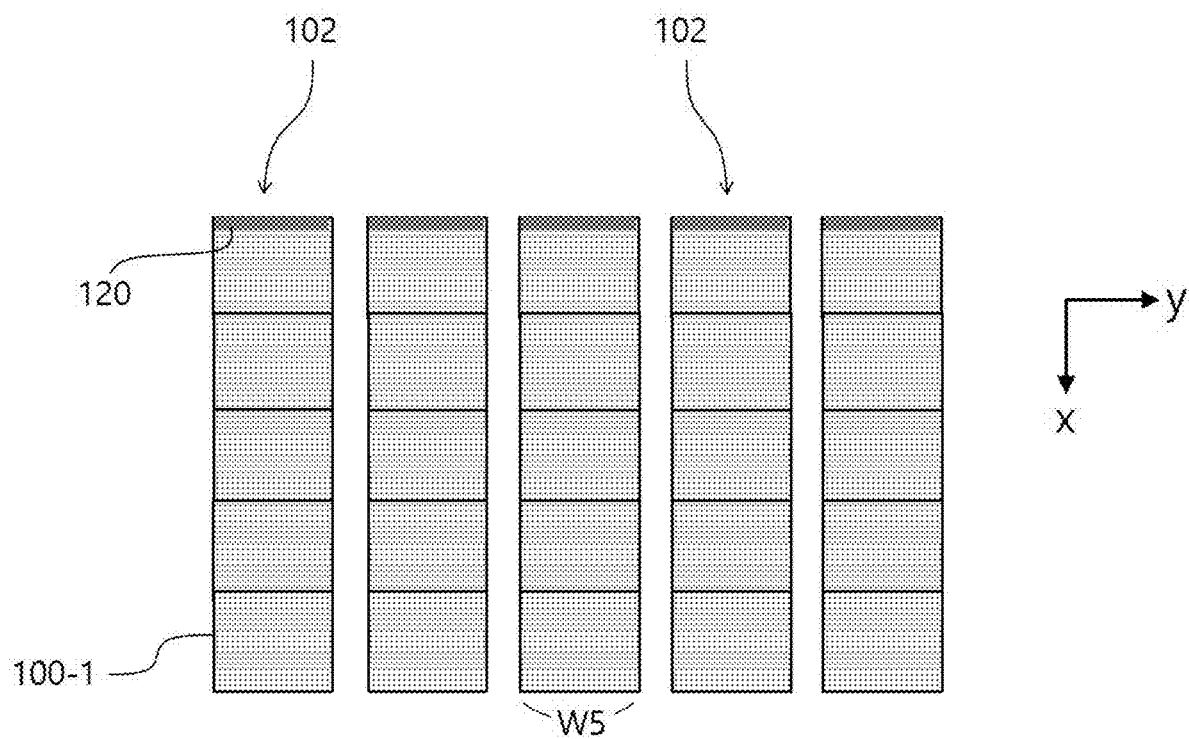
FIG. 8 is a diagram illustrating a process of forming a string by cutting the shingled-joined intermediate processing junction substrate along the second cut lines according to an embodiment of the present invention.

As shown in FIG. 8, when the intermediate processing junction substrate 100A is divided equally into five pieces by performing the secondary cutting, a plurality of strings 102 are obtained, and each string 102 has a structure in which five segmented cells 100-1 each having a predetermined width W5 are shingled-joined.

Figure 9:
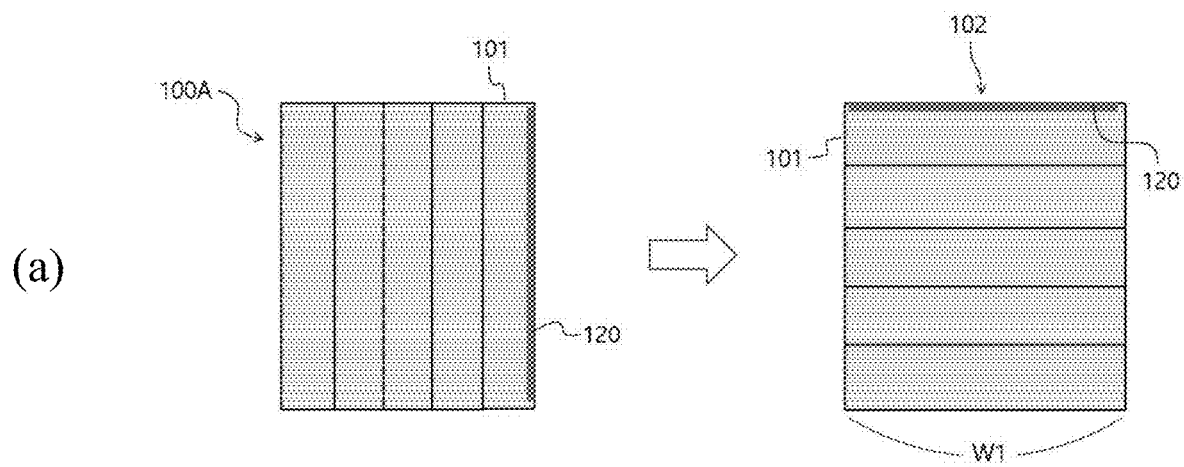
FIG. 9 shows diagrams illustrating a process of forming the string by cutting the shingled-joined intermediate processing junction substrate along the second cut lines each corresponding to a width set to the shingled-joined intermediate processing junction substrate according to an embodiment of the present invention.
Figure 9:
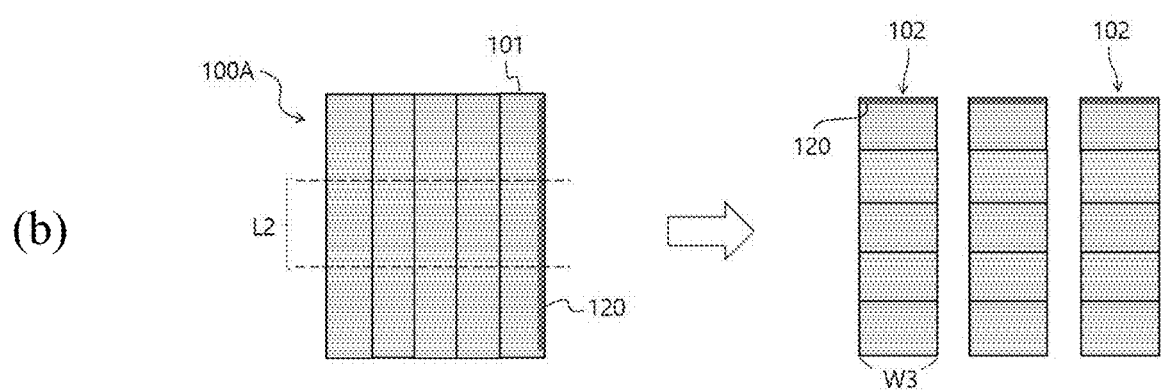

As described with reference to FIG. 3, the length of the string 102 increases or decreases according to the number of unit cells 101 which are shingled-joined, and a width of the string 102 may be set by the second cut line L2. For example, FIG. 9A shows a case in which the secondary cutting is not performed on the intermediate processing junction substrate 100A, and a width W1 of the string corresponds to the length of the bus bar electrode 120. As another example, FIG. 9B shows a case in which the secondary cutting is performed to divide the intermediate processing junction substrate 100A into equally-divided three pieces, and a width W3 of the string is smaller than the length of the bus bar electrode 120 and is greater than the width W5 of the string of each of the equally divided five pieces.

Figure 10:
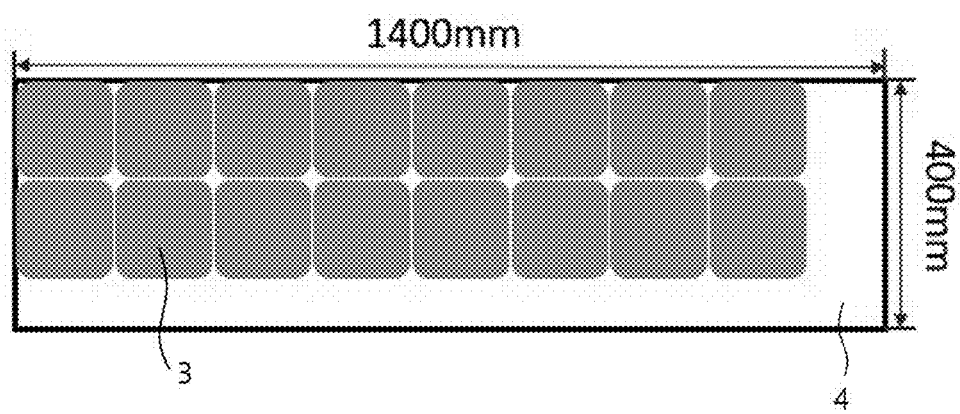
FIG. 10 shows diagrams for describing structures of photovoltaic modules structure manufactured according to the related art and an embodiment of the present invention.
Figure 10:
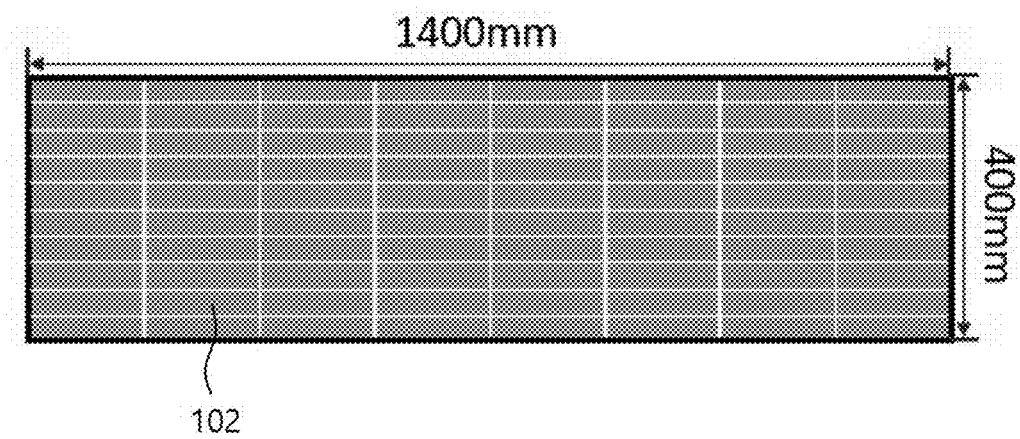

As described above, the shingled-joined intermediate processing junction substrate 100A according to the embodiment of the present invention is cut along the second cut line corresponding to the set width, and thus the width of the string may be varied so that it can be suitably used for manufacturing a designable photovoltaic module. As shown in FIG. 10A, when a photovoltaic module with a width of 1400 mm and a length of 400 mm is manufactured, since the photovoltaic module is formed by connecting undivided cells 3 of a predetermined size in the related art, widths and lengths of the cells 3 do not match the size of the photovoltaic module so that workability is degraded.

According to the embodiment of the present invention, as shown in FIG. 10B, when the photovoltaic module having the same size described above is formed, a plurality of strings 102 controllable in length and width may be connected to form the photovoltaic module, and thus workability is excellent.

Figure 11:
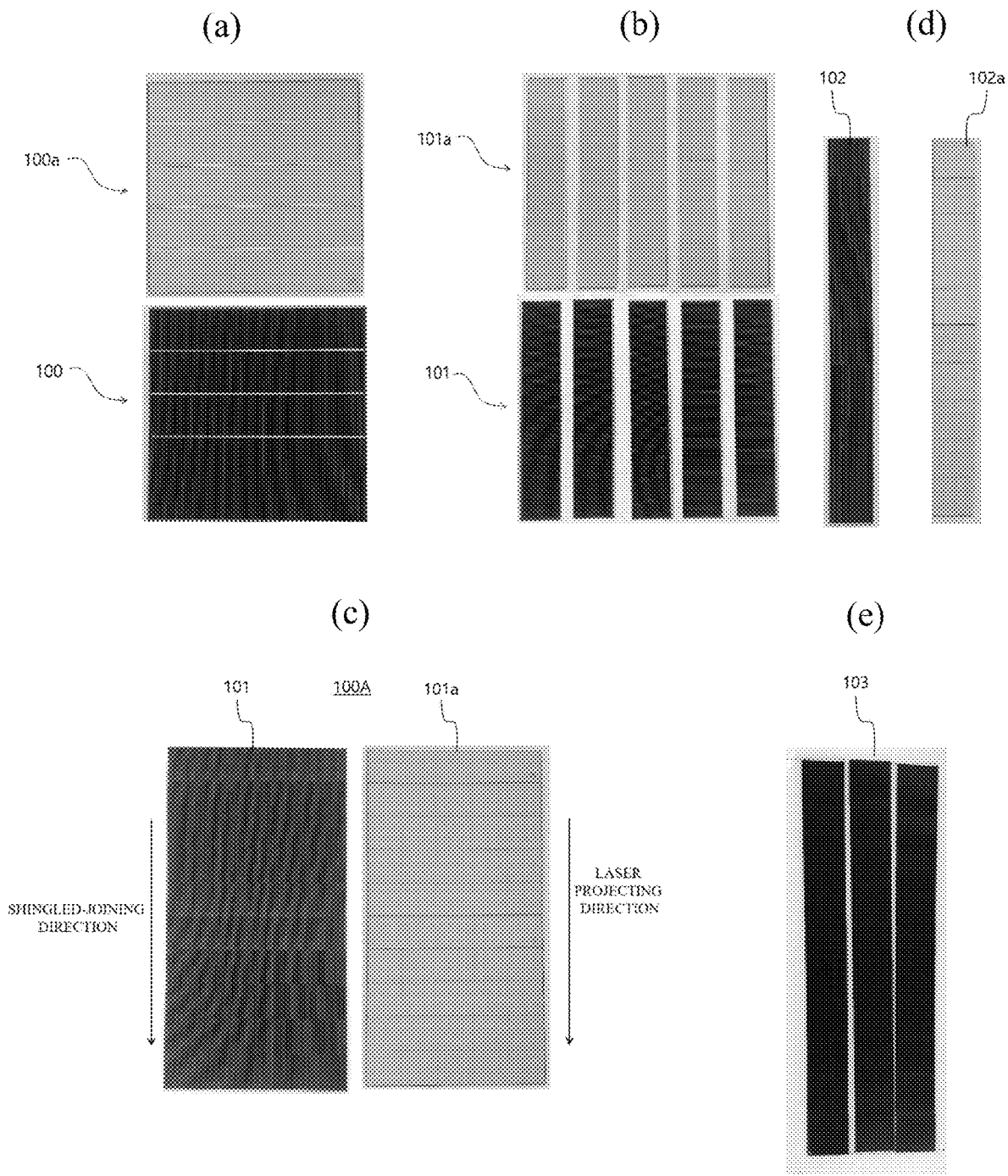
FIG. 11 shows prototype images of a high-power shingled photovoltaic string controllable in length and width according to an embodiment of the present invention.

As can be seen from a front image 100 and a rear image 100a in FIG. 11A, five first cut lines L1 and five second cut lines L2 were formed on a raw material of a prototype (the bulk silicon substrate). The first and second cut lines L1 and L2 correspond to a process of recessing a part of the substrate surface to form a groove of a predetermined depth, and then a cell may be divided and cut according to the corresponding cutting lines in the primary cutting and secondary cutting processes using cutting equipment, for example, a punch. As shown in FIG. 11B, unit cells 101 and 101a are obtained by equally dividing the bulk silicon substrate into five pieces according to the first cut lines L1.

Figure 12:
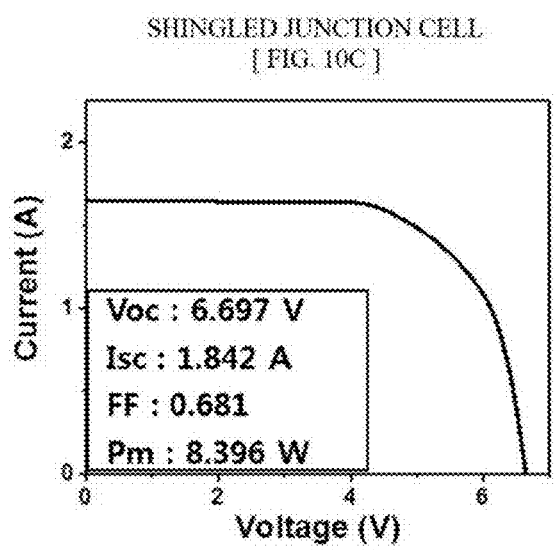
FIG. 12 shows performance test graphs for the prototype of FIG. 11.
Figure 12:
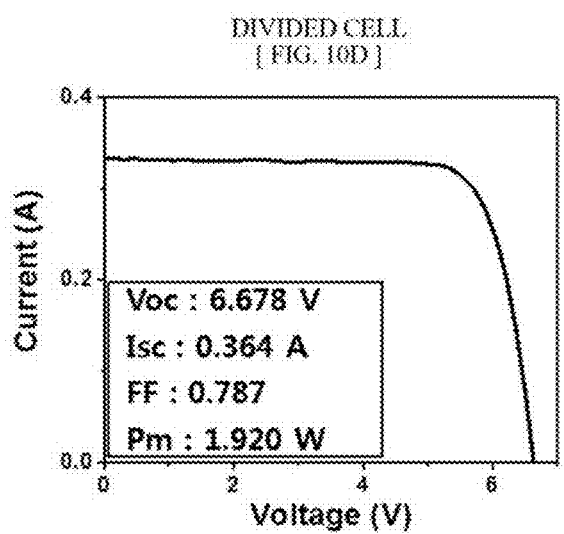
Figure 12:
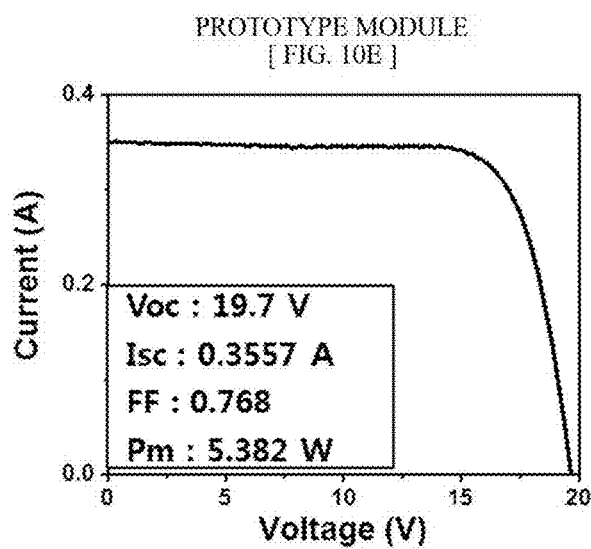

Then, the unit cells 101 are shingled-joined to form the intermediate processing junction substrate 100A. In FIG. 11C, a left side shows a front image 101 of the substrate 100A and a right side shows a rear image 101a of the substrate 100A, and the substrate 100A is obtained by shingled-joining ten divided cells 101. As shown in FIG. 12A, as a result of a performance test on the prototype, an open circuit voltage Voc of 6.697 V, a short circuit current Isc of 1.842 A, a measured power Pm of 8.396 W, and a curve factor FF of 0.681 were obtained.

The intermediate processing junction substrate 100A is divided in a laser projecting direction, which is the second cut lines perpendicular to the bus bar electrode, and thus strings are obtained. In FIG. 11D, from a front image 102 and a rear image 102a of the string, it can be seen that the string has a structure in which ten divided cells are shingled-joined. As shown in FIG. 12B, as a result of a performance test on the prototype, an open circuit voltage Voc of 6.678 V, a short circuit current Isc of 0.364 A, a measured power Pm of 1.920 W, and a curve factor FF of 0.787 were obtained.

As shown in FIG. 11E, a module prototype 103 is obtained by connecting three divided strings 102. As shown in FIG. 12C, as a result of a performance test on the module prototype, an open circuit voltage Voc of 19.7 V, a short circuit current Isc of 0.3557 A, a measured power Pm of 5.382 W, and a curve factor FF of 0.768 were obtained. Since the curve factor FF, which is a characteristic evaluation parameter for the module prototype, is 0.768, it can be confirmed that a high-power photovoltaic module can be manufactured.

Figure 13:
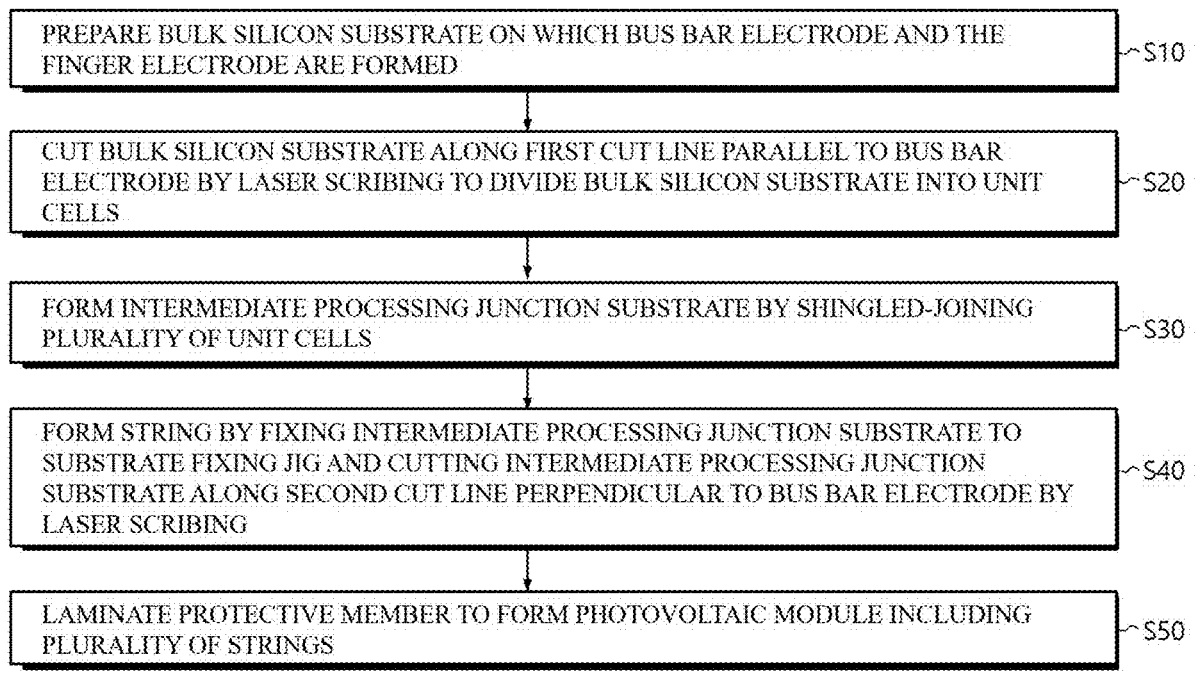
FIG. 13 is a flowchart for describing a method of manufacturing a high-power shingled photovoltaic string controllable in length and width according to an embodiment of the present invention.

FIG. 13 is a flowchart for describing a method of manufacturing a high-power shingled photovoltaic string controllable in length and width according to an embodiment of the present invention.

First, the bulk silicon substrate 100 on which the bus bar electrode 120 and the finger electrode 121 are formed is prepared (S10).

The bulk silicon substrate 100 is first cut along the first cut lines L1 parallel to the bus bar electrode 120 by laser scribing to divide the bulk silicon substrate 100 into unit cells 101 (S20). Process conditions for the laser scribing may be set such that an average power is 10 W, a frequency is 50 kHz, and a projecting speed is 1,300 mm/s in a 20 ns laser using a 532 nm wavelength to perform the laser scribing. In the embodiment, the first cut lines L1 and the second cut lines L2 are individually formed for cutting by the laser scribing, but after collectively forming the first cut lines L1 and the second cut lines L2 on the bulk silicon substrate 100, primary cutting, shingled-joining, and secondary cutting may be performed.

Next, a plurality of unit cells 101 are shingled-joined to form an intermediate processing junction substrate 100A to correspond to a string length (S30). In the shingled-joining process, the bus bar electrode 120 formed on a front surface of one divided unit cell 101 and the rear electrode 140 of another divided unit cell 101 overlap, and the overlapping portions are joined with the conductive adhesive 150 interposed therebetween through a thermal processing process. The bonding process may be performed under thermal processing conditions of a temperature ranging from 130° C. to 150° C. for 25 to 35 seconds.

Next, the intermediate processing junction substrate 100A is mounted on the substrate fixing jig 10 or 20 and is secondly cut by the laser scribing along the second cut lines L2 perpendicular to the bus bar electrode 120, thereby forming the strings 102 (S40). The second cut line L2 is set to correspond to a width of the string constituting the photovoltaic module.

Next, the plurality of strings 102 are connected, and surfaces of the plurality of strings 102 are laminated with a transparent protective member, thereby forming the photovoltaic module (S50). A 5 mm thick glass or ultra-thin fluoride resin film (polyethylene tetrafluoro ethylene (ETFE)) is used as the transparent protective member, but the present invention is not limited thereto, and any protective member as long as it can be laminated on the front and rear surfaces of the cell string 110 with a thickness of 0.2 mm and can prevent external impact and foreign material penetration may be applied.

INDUSTRIAL APPLICABILITY

According to the present invention, when a string constituting a photovoltaic module is formed, the number of joining processes of divided cells can be reduced to increase the manufacturing efficiency of the photovoltaic module, and a length and a width of the string can be controlled so that the photovoltaic module can be used for exterior wall and window replacement facilities of buildings, farming facilities, urban distributed power supply, photovoltaic sound barriers, and soundproof tunnels.

The invention claimed is:

1. A method of manufacturing a shingled photovoltaic module controllable in length and width, the method comprising:
   (a) preparing a bulk silicon substrate on which bus bar electrodes and finger electrodes are formed;
   (b) primarily cutting the bulk silicon substrate along first cut lines parallel to the bus bar electrodes by laser scribing to divide the bulk silicon substrate into a plurality of unit cells;
   (c) shingled-joining the plurality of unit cells to correspond to a length of each of a plurality of strings to form an intermediate processing junction substrate;
   (d) mounting the intermediate processing junction substrate on a substrate fixing jig and secondarily cutting the intermediate processing junction substrate along second cut lines perpendicular to the bus bar electrodes by laser scribing to form the plurality of strings; and
   (e) laminating surfaces of the plurality of strings using a protective member to form the photovoltaic module,
   wherein the first cut lines are set to correspond to an interval between the bus bar electrodes, and
   wherein the second cut lines line are set to correspond to a width of each of the plurality of strings constituting the photovoltaic module.

2. The method of claim 1, wherein the substrate fixing jig is provided with a plate having a step on a surface of a body thereof corresponding to a shape of the intermediate processing junction substrate or fixes the intermediate processing junction substrate using a holder configured to fix one side of the intermediate processing junction substrate.

3. A method of manufacturing a shingled photovoltaic module controllable in length and width, the method comprising:
   (a) preparing a bulk silicon substrate on which bus bar electrodes and finger electrodes are formed;
   (b) primarily cutting the bulk silicon substrate along first cut lines parallel to the bus bar electrodes by laser scribing to divide the bulk silicon substrate into a plurality of unit cells;
   (c) shingled-joining the plurality of unit cells to correspond to a length of each of a plurality of strings to form an intermediate processing junction substrate;
   (d) mounting the intermediate processing junction substrate on a substrate fixing jig and secondarily cutting the intermediate processing junction substrate along second cut lines perpendicular to the bus bar electrodes by laser scribing to form the plurality of strings; and
   (e) laminating surfaces of the plurality of strings using a protective member to form the photovoltaic module,
   wherein the first cut lines are set to correspond to an interval between the bus bar electrodes, and
   wherein the second cut lines line are set to correspond to a width of each of the plurality of strings constituting the photovoltaic module,
   wherein, after the first cut lines and the second cut lines have been formed on the bulk silicon substrate, the primary cutting is performed.

4. A method of manufacturing a shingled photovoltaic module controllable in length and width, the method comprising:
   (a) preparing a bulk silicon substrate on which bus bar electrodes and finger electrodes are formed;
   (b) primarily cutting the bulk silicon substrate along first cut lines parallel to the bus bar electrodes by laser scribing to divide the bulk silicon substrate into a plurality of unit cells;
   (c) shingled-joining the plurality of unit cells to correspond to a length of each of a plurality of strings to form an intermediate processing junction substrate;
   (d) mounting the intermediate processing junction substrate on a substrate fixing jig and secondarily cutting the intermediate processing junction substrate along second cut lines perpendicular to the bus bar electrodes by laser scribing to form the plurality of strings; and
   (e) laminating surfaces of the plurality of strings using a protective member to form the photovoltaic module,
   wherein the first cut lines are set to correspond to an interval between the bus bar electrodes, and
   wherein the second cut lines line are set to correspond to a width of each of the plurality of strings constituting the photovoltaic module,
   wherein, after the bulk silicon substrate has been divided into the unit cells, the second cut lines are formed by laser scribing.

* * * * *